United States Patent [19]

Quigley et al.

[11] Patent Number: 5,610,425

[45] Date of Patent: Mar. 11, 1997

[54] INPUT/OUTPUT ELECTROSTATIC DISCHARGE PROTECTION CIRCUIT FOR AN INTEGRATED CIRCUIT

[75] Inventors: John H. Quigley; David F. Mietus, both of Phoenix, Ariz.

[73] Assignee: Motorola, Inc., Schaumburg, Ill.

[21] Appl. No.: 384,047

[22] Filed: Feb. 6, 1995

[51] Int. Cl.$^6$ .................................................. H01L 23/62
[52] U.S. Cl. ...................... 257/358; 257/111; 257/140; 257/141; 257/357
[58] Field of Search ................................... 257/111, 112, 257/159, 175, 133, 551, 603, 139, 140, 141, 357, 355, 356, 328, 338, 358; 361/90, 91

[56] References Cited

U.S. PATENT DOCUMENTS

| | | |
|---|---|---|
| 4,400,711 | 8/1983 | Avery . |
| 4,484,244 | 11/1984 | Avery . |
| 4,595,941 | 6/1986 | Avery . |
| 4,633,283 | 12/1986 | Avery . |
| 5,010,380 | 4/1991 | Avery . |
| 5,072,273 | 12/1991 | Avery . |
| 5,157,573 | 10/1992 | Lee et al. .................................. 361/56 |
| 5,182,220 | 1/1993 | Ker et al. ................................ 257/133 |
| 5,276,350 | 1/1994 | Merrill et al. ........................... 257/603 |
| 5,287,241 | 2/1994 | Puar ......................................... 361/56 |
| 5,400,202 | 3/1995 | Metz et al. ............................... 361/56 |
| 5,416,494 | 5/1995 | Yokota et al. ............................ 345/79 |
| 5,418,383 | 5/1995 | Takagi et al. ............................ 257/48 |
| 5,442,220 | 8/1995 | Arai ....................................... 257/133 |
| 5,452,171 | 9/1995 | Metz et al. ............................... 361/56 |
| 5,465,189 | 11/1995 | Polgreen et al. .......................... 361/58 |

*Primary Examiner*—Jerome Jackson, Jr.
*Assistant Examiner*—Courtney A. Bowers
*Attorney, Agent, or Firm*—Gary W. Hoshizaki

[57] ABSTRACT

An Input/Output (I/O) circuit (11) for an integrated circuit including Electrostatic Discharge Protection (ESD) circuitry is disclosed. A Silicon Controlled Rectifier SCR (30) is triggered by a transistor (36) which is scaled to an output transistor (24) of the I/O circuit (11) to shunt an ESD event. The SCR (30) couples between a pad (12) and a power supply line $V_{SS}$. The transistor (36) is disabled. The triggering mechanism is voltage breakdown of the transistor (36) due to an ESD event. The SCR protection mechanism is process independent since the triggering mechanism is formed similarly to the output transistor (24) and thus breaks-down similarly. Zener diodes (26–29) are coupled to gates of the I/O circuit (11) and between the power supply lines. A phosphorous doping less than 5.0 E18 per cubic centimeter is used to form the cathode of zener diodes (26–29).

12 Claims, 6 Drawing Sheets

INPUT/OUTPUT ELECTROSTATIC DISCHARGE PROTECTION CIRCUIT FOR AN INTEGRATED CIRCUIT

BACKGROUND OF THE INVENTION

This invention relates, in general, to high voltage protection circuitry for an integrated circuit, and more particularly, to Electrostatic Discharge (ESD) Protection for an Input/Output (I/O) circuit of an integrated circuit.

The Input/Output (I/O) circuitry of an integrated circuit is the interface circuitry between circuitry external to the integrated circuit and circuitry internal to the integrated circuit. Input circuitry buffers incoming signals for the internal circuitry of the integrated circuit. Output circuitry buffers signals from the internal circuitry of the integrated circuit and typically comprises power transistors for driving large capacitive loads (for example, a bus line).

Static Discharge is common to any component that is handled. An Electrostatic Discharge (ESD) event to an integrated circuit can couple thousands of voltages to the integrated circuit. An ESD event is coupled through I/O circuitry since it is the interface between the internal circuitry of the integrated circuit and the external world. An ESD event is indiscriminate in its entry to the integrated circuit. The ESD event is coupled to any I/O circuit of the integrated circuit or between I/O circuits of the integrated circuits.

ESD protection circuitry is incorporated in I/O circuitry of an integrated circuit. The ESD protection circuitry dissipates an ESD event before harmful voltages or currents can damage circuitry of the integrated circuit. A problem with ESD protection circuitry is the protection mechanism is process dependent. Both the breakdown mechanism (due to an ESD event) of a device in the I/O circuitry and the point at which the ESD protection circuitry is enabled will vary depending on process variations. The ESD protection circuitry is often compromised to take into account all the different variations that could occur.

A second problem with ESD protection circuitry is protecting for all possible ESD events. Both positive and negative ESD events can occur. An ESD event can be coupled to a single pad or between pads of an integrated circuit. Power supply pads will couple an ESD event to all I/O circuitry. Most ESD protection schemes do not provide adequate protection due to area constraints or limited protection devices.

It would be of great benefit if an ESD protection circuit could be provided that is process independent and provides protection from most ESD events that can occur on an integrated circuit.

DETAILED DESCRIPTION OF THE DRAWINGS

In general, an Input/Output (I/O) circuit of an integrated circuit couples to a pad for receiving or providing a signal. Input/Output circuits are typically located near the periphery of an integrated circuit die. A pad is a large metal area for providing electrical interconnection external to the integrated circuit. An integrated circuit may have hundreds or thousands of metal pads for external interconnection. An example of a typical external interconnection to a pad of an integrated circuit is a lead of an integrated circuit package. The lead is coupled to a pad via a wire. Another example of an external interconnection to a pad is a solder bump. Multi-chip module technology utilizes solder bumps to electrically couple pads of different substrates together.

It is well known that the high voltage of a static discharge is capable of damaging a semiconductor device. An integrated circuit is potentially exposed to a static discharge anytime it is handled by a human or machine. A static discharge to an integrated circuit is called an Electrostatic Discharge (ESD) event. An ESD event enters through a metal pad and typically damages a device in an I/O circuit. An ESD event is categorized in two ways, first, an ESD event can occur between any two pads of an integrated circuit, and second, an ESD event can occur between an integrated circuit and any other object.

The protection provided by ESD circuitry on an I/O circuit is typically measured using MIL-STD 883C or DoD-STD 1686A. An ESD tester provides an ESD event of a specific voltage and current waveform. The ESD tester provides an ESD event between any two pads (or groups of pads) of an integrated circuit. Thus, an ESD protection circuit must protect an integrated circuit from an ESD between any two I/O pads, an I/O pad to power supply line, or between the power supply lines.

Figure 1:
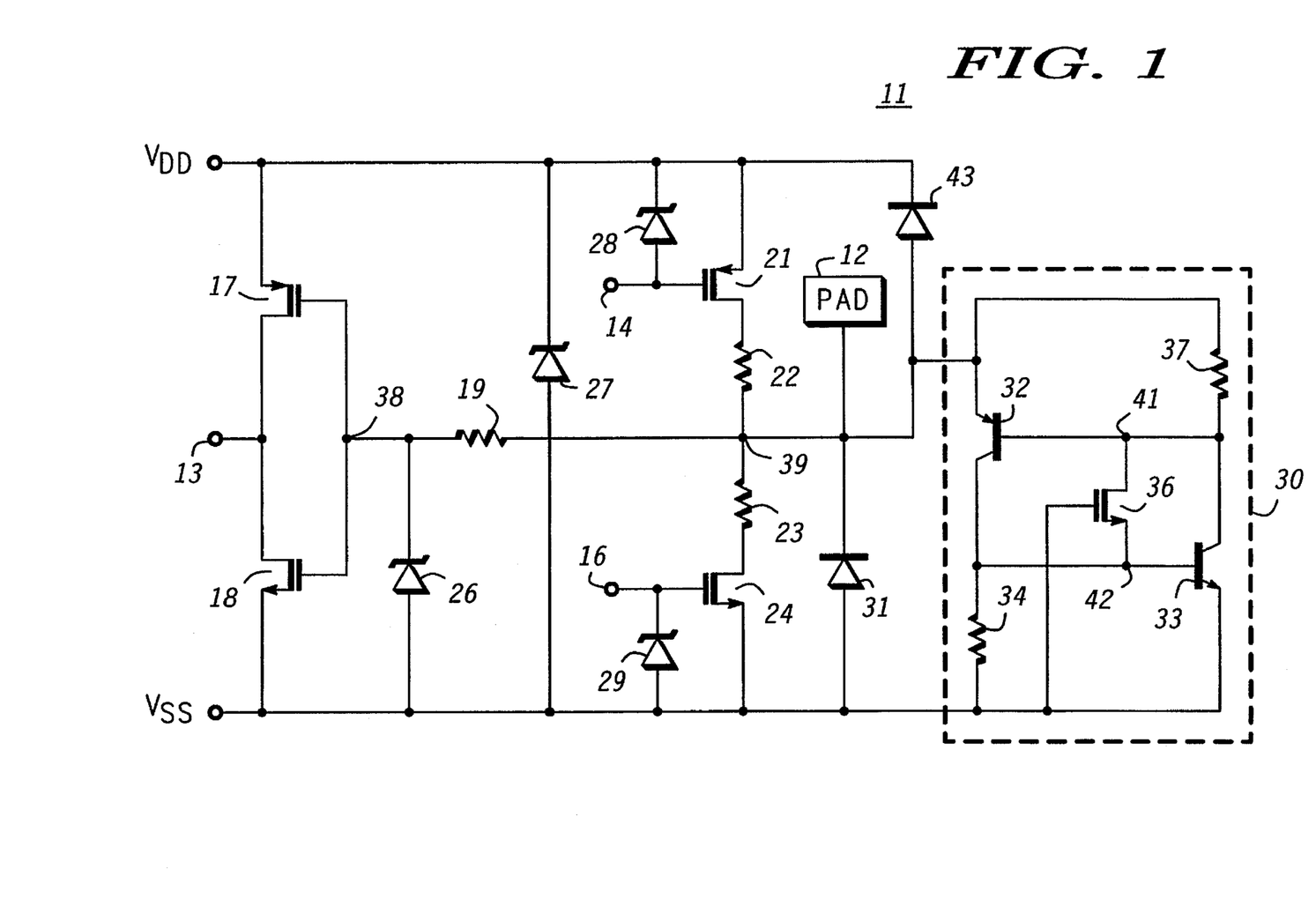
FIG. 1 is a schematic diagram of an Input/Output (I/O) circuit of an integrated circuit including Electrostatic Discharge (ESD) Protection circuitry in accordance with the present invention.

FIG. 1 is a schematic diagram of a typical Input/Output (I/O) circuit 11 of an integrated circuit including Electrostatic Discharge (ESD) Protection circuitry.

A pad 12 is an external interconnection point for the I/O circuit 11. The Input/Output circuitry of I/O circuit 11 comprises transistors 17, 18, 21, and 24, and resistors 19, 22, and 23. The ESD protection circuitry of I/O circuit 11 comprises transistors 32, 33, and 36, zener diodes 26–29, diodes 31 and 43, and resistors 34 and 37. Transistors 17, 18, 21, 24, and 36 are enhancement Metal Oxide Semiconductor Field Effect Transistors (MOSFETs) each having a drain, gate, and source, respectively corresponding to a first electrode, a control electrode, and a second electrode. Transistors 17 and 21 are p-channel MOSFETs and transistors 18, 24, and 36 are n-channel MOSFETs. Transistor 32 and 33 are bipolar transistors each having a collector, base, and emitter respectively corresponding to a first electrode, a control electrode, and a second electrode. Transistor 32 is a PNP transistor and transistor 33 is a NPN transistor.

Transistors 17 and 18 form a buffer circuit (inverter). Transistor 17 has a drain coupled to an output 13, a gate coupled to a node 38, and a source coupled for receiving a power supply voltage $V_{DD}$. Transistor 18 has a drain coupled to output 13, a gate coupled to node 38, and a source coupled for receiving a power supply voltage $V_{SS}$. Resistor 19 has a first terminal coupled to node 38 and a second terminal coupled to a node 39. Pad 12 couples to node 39. A signal coupled to pad 12 is coupled to the buffer circuit formed by transistors 17 and 18 via resistor 19 and provides a buffered signal at output 13 to internal circuitry (not shown) of the integrated circuit. Resistor 19 reduces the speed of a high speed transient signal such as an ESD event that could damage transistors 17 and 18.

Transistors 21 and 24 form an output buffer for driving circuitry external to the integrated circuit. Transistors 21 and 24 are typically large power transistors. Transistor 21 has a drain, a gate coupled to an input 14, and a source coupled for receiving the power supply voltage $V_{DD}$. Resistor 22 has a first terminal coupled to the drain of transistor 21 and a second terminal coupled to node 39. Transistor 24 has a drain, a gate coupled to an input 16, and a source coupled for receiving the power supply voltage $V_{SS}$. Resistor 23 has a first terminal coupled to node 39 and a second terminal coupled to the drain of transistor 24. A signal from the internal circuitry of the integrated circuit is provided to either input 14 or 16 for respectively enabling transistor 21 or 24 to provide an output signal of the integrated circuit to pad 12.

Resistors 22 and 23 are ballast resistors (of a low impedance) well known by one skilled in the art for insuring a large current is distributed equally throughout a power transistor by preventing any single area from dominating current conduction. A large current through any portion of a power transistor produces a voltage drop across a ballast resistance local to that area. Since the voltage at node 39 is set by the ESD event the ballasting forces equal amounts of current through each ballast resistor.

In general, the I/O circuitry described herein is a tri-state buffer circuit. A signal is coupled to pad 12 from circuitry external to the integrated circuit (transistors 21 and 24 are disabled). The signal is buffered by an inverter formed by transistors 17 and 18 and provided at output 13 for being received by internal circuitry of the integrated circuit. Conversely, a signal from the internal circuitry of the integrated circuit enables either transistor 21 (via input 14) or transistor 24 (via input 16) for providing an output signal at pad 12. It is believed that the operation of an I/O circuit is well known. Furthermore, it should be obvious to one skilled in the art that an input circuit (alone) or an output circuit (alone) would also require at least a portion of the ESD protection circuitry shown in FIG. 1.

The ESD protection circuitry protects against an ESD event between pads of an integrated circuit or between a pad and an external object. Several different types of circuitry are used in I/O circuit 11 to provide this protection. A first defense against an ESD event is to protect transistor gates. Gates of a MOSFET transistor are isolated from an active area by a very thin layer of silicon dioxide. The thin layer of silicon dioxide is susceptible to damage above a predetermined voltage. A zener diode is coupled to each gate that will breakdown before the predetermined voltage is reached thus preventing a gate from being damaged. The breakdown voltage of a zener diode is very predictable and is controlled by the p and n doping levels of the device.

Zener diode 26 has an anode coupled for receiving the power supply voltage $V_{SS}$ and a cathode coupled to node 38. Zener diode 26 protects the gates of transistors 17 and 18 from an ESD event coupled to either pad 12 or a power supply line $V_{SS}$.

Zener diode 29 has an anode coupled for receiving the power supply voltage $V_{SS}$ and a cathode coupled to input 16. Zener diode 29 protects the gate of transistor 24 from an ESD event coupled to the power supply line $V_{SS}$.

Zener diode 28 has an anode coupled to input 14 and a cathode coupled for receiving the power supply voltage $V_{DD}$. Zener diode 28 protects the gate of transistor 21 from an ESD event coupled to a power supply line $V_{DD}$.

A second defense against an ESD event is to prevent a static discharge from increasing a voltage across the power supply lines of the integrated circuit. A zener diode is used to clamp the power supply lines from exceeding a damaging voltage. Zener diode 27 has an anode coupled for receiving the power supply voltage $V_{SS}$ and a cathode coupled for receiving the power supply voltage $V_{DD}$.

A third defense against an ESD event is to prevent pad 12 from going above the positive most power supply line or from going below the negative most power supply line. Diode 43 becomes forward biased when pad 12 is coupled to a voltage greater than a diode voltage drop above the power supply voltage $V_{DD}$. Diode 43 has an anode coupled to node 39 and a cathode coupled for receiving the power supply voltage $V_{DD}$. Diode 31 becomes forward biased when pad 12 is coupled to a voltage less than a diode voltage drop below the power supply voltage $V_{SS}$. Diode 31 has an anode coupled for receiving the power supply voltage $V_{SS}$ and a cathode coupled to node 39. In the preferred embodiment, diodes 31 and 43 are formed in transistors 21 and 24. Diode 31 is formed by the n-type drain of transistor 24 and a p-substrate (coupled for receiving the power supply voltage $V_{SS}$). Diode 43 is formed by the p-type drain of transistor 21 and a n-well (coupled for receiving the power supply voltage $V_{DD}$) in which transistor 21 is formed.

A fourth and final defense against an ESD event is provided by an SCR 30. SCR 30 has a low impedance which would short an ESD event when enabled. SCR 30 is coupled between pad 12 and the power supply line coupled for receiving the power supply voltage $V_{SS}$. SCR 30 comprises transistors 32, 33, and 36, and resistors 34 and 37.

Transistor 32 has a collector coupled to a node 42, a base coupled to a node 41, and an emitter coupled to node 39. Resistor 34 has a first terminal coupled to node 42 and a second terminal coupled for receiving the power supply voltage $V_{SS}$. Transistor 33 has a collector coupled to node 41, a base coupled to node 42, and an emitter coupled for receiving the power supply voltage $V_{SS}$. Transistor 36 has a drain coupled to node 41, a gate coupled for receiving the power supply voltage $V_{SS}$ and a source coupled to node 42. Resistor 37 has a first terminal coupled to node 39 and a second terminal coupled to node 41.

SCR 30 is enabled by a positive ESD event on pad 12 or a negative ESD event coupled to the power supply line $V_{SS}$. SCR 30 is not enabled during normal operation of the integrated circuit but is enabled by an ESD event. Two breakdown mechanisms commonly occur during an ESD event that damage an output transistor (21,24) of I/O circuit 11. Most prevalent of the two breakdown mechanisms is a pn junction breakdown. For example, the junction formed by the drain (n-type) of transistor 24 and the (p-type) substrate has been empirically found to be prone to damage due to an ESD event. The other breakdown mechanism is known as punch-through. Punch-through occurs when the depletion region of the drain junction extends to the depletion region of the source junction. The majority carriers of the source region are injected into the depleted channel region, where they will be swept by the field and collected at the drain. A punch-through implant is often added in the formation of a transistor to increase the dopant in the channel thus suppressing depletion.

Transistor 36 is formed by the same process steps as transistor 24 so that transistor 36 has characteristics similar to that of transistor 24. In the preferred embodiment, the width of transistor 36 is less than the width of transistor 24. The gate of transistor 36 is coupled for receiving the power supply voltage $V_{SS}$ so that it is permanently disabled. SCR 30 is enabled when an ESD event causes transistor 36 to breakdown. Current conduction through transistor 36 enables transistors 32 and 33. Positive feedback enables SCR 30 to change from an open circuit to an extremely low impedance that prevents the ESD event from damaging the I/O circuitry. Utilizing the same breakdown mechanism (breakdown of transistor 36) that would occur in an unprotected ESD event (breakdown of transistor 24) to enable protection circuitry allows for an extremely accurate method for triggering SCR 30 to prevent damage to the I/O circuitry. In other words, the triggering relationship between SCR 30 and transistor 24 is now process independent. Changes in the breakdown voltage due to process variations will always be mirrored in the transistor enabling SCR 30.

Prior art SCR's with low voltage triggers do not automatically track the I/O circuitry being protected. A situation could arise where a breakdown voltage of a device in an I/O circuit would be greatly reduced due to process variations while the predetermined voltage to trigger the SCR would increase. The SCR would not trigger in time to protect the I/O circuitry. The ESD protection circuitry described in FIG. 1 tracks the breakdown mechanism as a process varies. If breakdown occurs at a low voltage SCR 30 is triggered at the lower voltage, similarly if breakdown occurs at a high voltage SCR 30 is triggered at the higher voltage. The ESD protection circuitry of FIG. 1 has been tested on a submicron gate length process with a commercial ESD tester and has successfully protected up to 14,000 volt static discharges.

Figure 2:
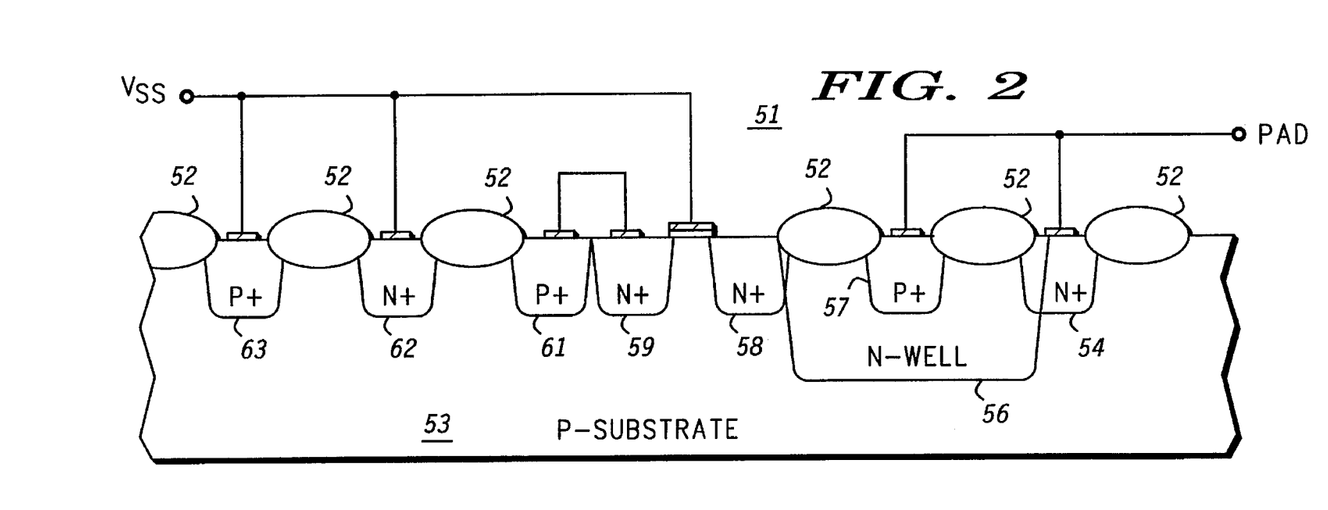
FIG. 2 is a cross-sectional view of a Silicon Controlled Rectifier (SCR) for the I/O circuit of FIG. 1 in accordance with the present invention.

FIG. 2 is a cross-sectional view of an SCR structure 51 corresponding to SCR 30 of FIG. 1. In the preferred embodiment, SCR structure 51 is formed in a P-substrate 53. A PNP vertical transistor corresponding to transistor 32 of FIG. 1 is formed by a P+ region 57 (emitter), a N-Well 56 (base), and P-substrate 53 (collector). P+ region 57 couples to a pad. A resistance corresponding to resistor 34 is a parasitic resistance of P-substrate 53. The substrate resistance is measured from n-well 56 to a P+ region 63 (P-substrate contact). P+ region 63 is coupled for receiving a power supply voltage $V_{SS}$.

A NPN transistor corresponding to transistor 33 of FIG. 1 is formed by N-Well 56 (collector), P-substrate 53 (base), and a N+ region (62). N+ region 62 is coupled for receiving the power supply voltage $V_{SS}$. N-Well 56 is coupled to the pad by a N+ region 54. A resistance corresponding to resistor 37 of FIG. 1 is a parasitic resistance of N-Well 56. The N-Well resistance is measured from P+ region 57 to N+ region 54.

A transistor corresponding to transistor 36 of FIG. 1 is formed by a N+ region 58 (drain) and a N+ region 59 (source). A thin layer of gate oxide isolates a gate coupled for receiving the power supply voltage $V_{SS}$ from P-substrate 53. As mentioned previously, the transistor is formed using a same wafer process flow that forms transistor 24 of FIG. 1. N+ region 59 is coupled to P-substrate 53 via a P+ region 61.

Figure 3:
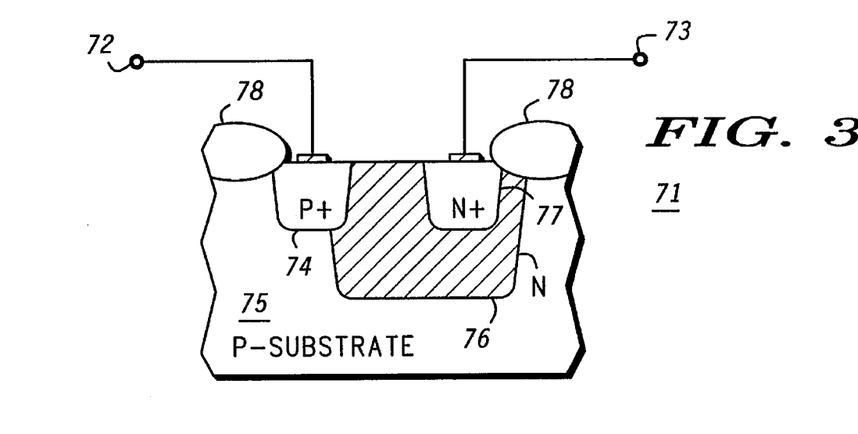
FIG. 3 is a cross-sectional view of a zener diode for the I/O circuit of FIG. 1 in accordance with the present invention.

FIG. 3 is a cross-sectional view of a zener diode structure 71 corresponding to zener diodes 26, 27, and 29 of FIG. 1. Although effective for protecting gates of a transistor, a zener diode does have one problem that prevents it from normally being incorporated in ESD protection circuitry. The problem with zener diodes is leakage current which increases DC bias current. A zener diode using implants common to a standard CMOS process has too much leakage current for use as an ESD protection circuit. Since many integrated circuits are powered by battery, high leakage currents will reduce battery life. Another factor is the speed at which a zener diode responds to an ESD event.

The doping of zener diode structure 71 allows for a fast response time and low leakage. Zener diode structure 71 is formed in a P-substrate 75. A P+ region 74 is an anode and a N region 76 is a cathode of zener diode structure 71. P+ region 74 couples to terminal 72. A N+ region 77 is a low resistance contact region to N region 76. N+ region 77 couples to a terminal 73.

In the preferred embodiment, P+ region 74 is a boron implant and N region 76 is a phosphorous implant. P+ region 74 is a typical drain implant. N region 76 has a phosphorous doping less than 5.0 E18 per cubic centimeter to produce a low leakage zener diode. Lightly Doped Drains (LDD) typically have dopings greater than 5.0 E18 which forms zener diodes that have high leakage currents and are not suitable for use as ESD protection diodes.

Zener diode 27 is placed in each I/O circuit. Each Zener diode in every I/O circuit of an integrated circuit breaks-down at approximately the same voltage thereby distributing current from an ESD event throughout the integrated circuit. Prior art protection schemes sometimes use a single device that dissipates the energy of an ESD event.

Figure 4:
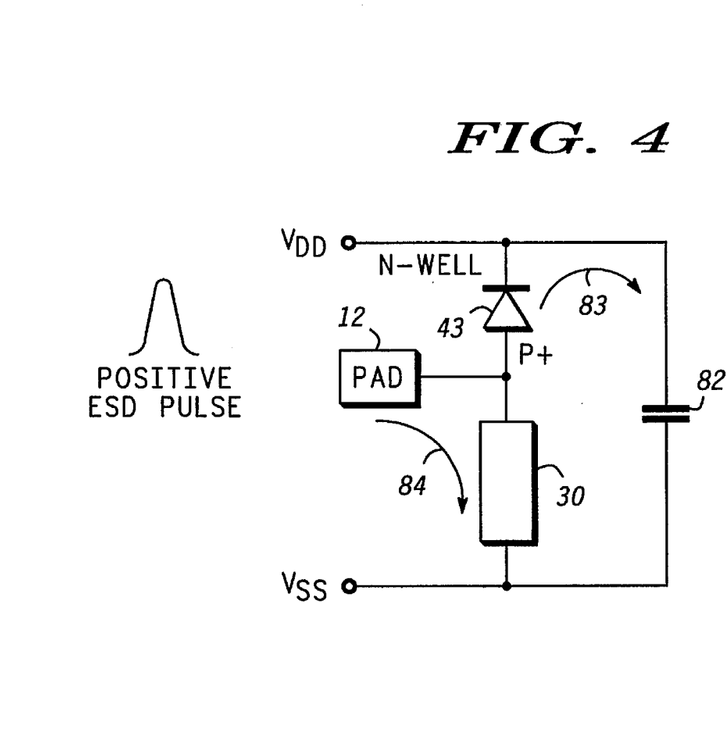
FIG. 4 is a diagram illustrating ESD protection circuitry for dissipating a positive ESD pulse, the ESD protection circuitry comprising diode 43 and SCR 30 of FIG. 1.

FIG. 4 is a diagram of a portion of the ESD circuitry of FIG. 1. An ESD event occurs from pad 12 to the power supply line $V_{SS}$. The devices that prevent damaging voltages from occurring are diode 43 and SCR 30. Diode 43 is a parasitic diode formed by the N-Well and P+ drain of transistor 21 of FIG. 1 (not shown). A parasitic capacitance couples between power supply lines $V_{DD}$ and $V_{SS}$.

A positive ESD pulse is applied across pad 12 and the power supply line $V_{SS}$. Diode 43 becomes forward biased as the voltage on pad 12 exceeds the power supply voltage $V_{DD}$. An arrow 83 indicates a transient current path of the ESD event through diode 43 and parasitic capacitance 82. SCR 30 is enabled by the positive ESD pulse. SCR 30 shorts pad 12 to the power supply line $V_{SS}$. The low impedance of SCR 30 dissipates the positive ESD pulse.

Figure 5:
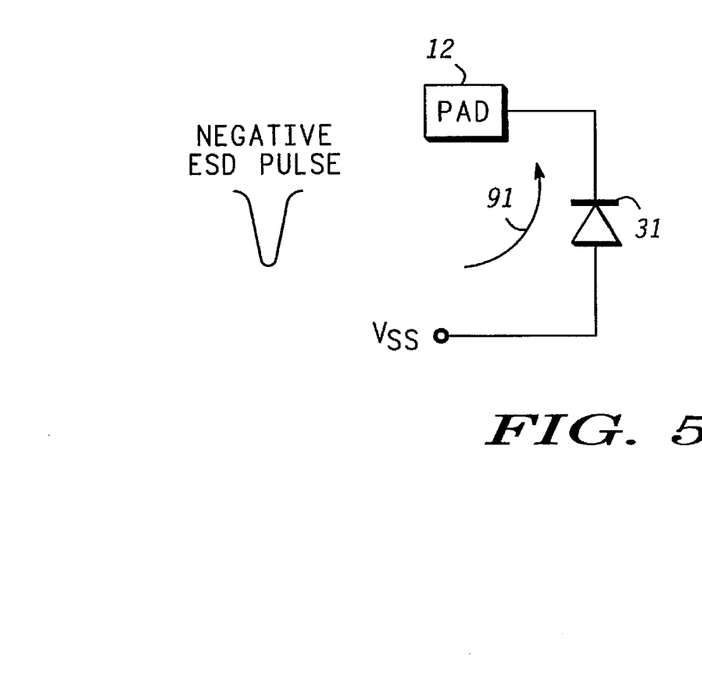
FIG. 5 is a diagram illustrating ESD protection circuitry for dissipating a negative ESD pulse, the ESD protection circuitry comprising diode 31 of FIG. 1.

FIG. 5 is a diagram of a portion of the ESD circuitry of FIG. 1 for dissipating a negative ESD pulse applied between pad 12 and the power supply line $V_{SS}$. Diode 31 is a parasitic diode formed by the p-substrate and N+ drain of transistor 24 of FIG. 1 (not shown). Diode 31 becomes forward biased when a negative voltage at pad 12 exceeds the power supply voltage $V_{SS}$. The forward biased diode clamps a voltage at pad 12 to a diode voltage drop higher than the power supply voltage $V_{SS}$ thereby preventing any circuitry from being damaged. An arrow 91 indicates a transient current path for the ESD event.

Figure 6:
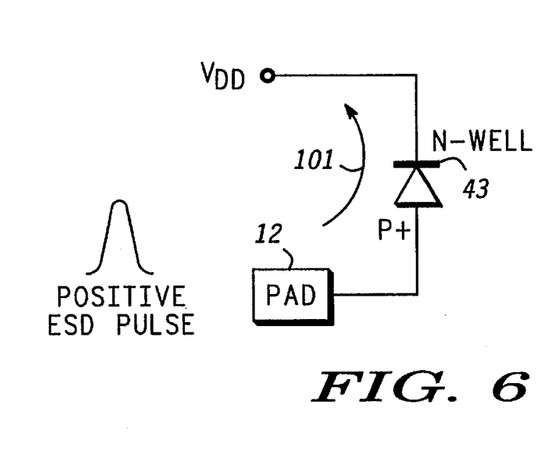
FIG. 6 is a diagram illustrating ESD protection circuitry for dissipating a positive ESD pulse, the ESD protection circuitry comprising diode 43 of FIG. 1.

FIG. 6 is a diagram of a portion of the ESD circuitry of FIG. 1 for dissipating a positive ESD pulse applied between pad 12 and the power supply line $V_{DD}$. Diode 43 is forward biased by the positive ESD pulse when the voltage on pad 12 exceeds the power supply voltage $V_{DD}$. Diode 43 clamps the voltage at pad 12 to a diode voltage drop greater than the power supply voltage $V_{DD}$ thereby preventing any damage to circuitry coupled to pad 12. The transient current path is indicated by an arrow 101.

Figure 7:
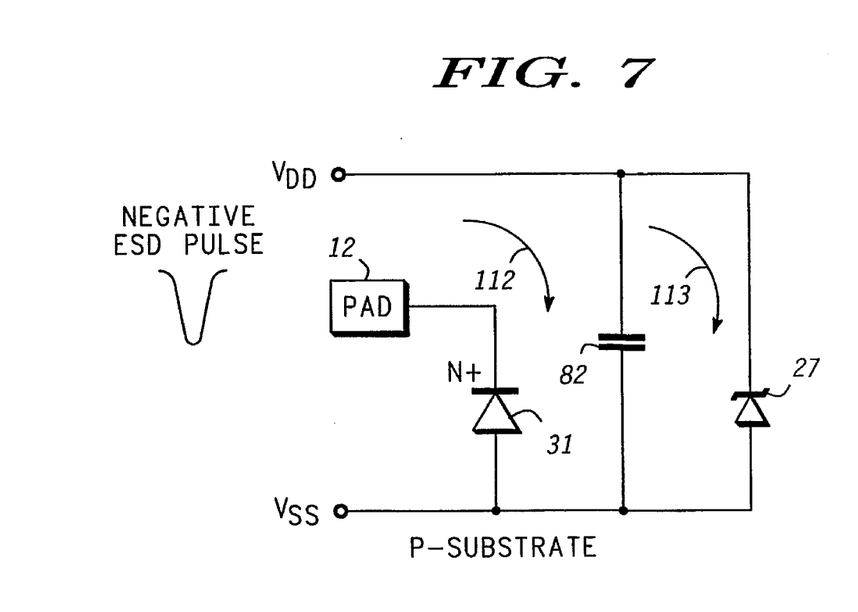
FIG. 7 is a diagram illustrating ESD protection circuitry for dissipating a negative ESD pulse, the ESD protection circuitry comprising diode 31 and zener diode 27 of FIG. 1.

FIG. 7 is a diagram of a portion of the ESD protection circuitry of FIG. 1 for dissipating a negative ESD pulse applied between pad 12 and the power supply line $V_{DD}$. The ESD protection circuitry comprises diode 31 and zener diode 27.

The negative ESD pulse forward biases diode 31 when pad 12 has a negative voltage that exceeds the power supply voltage $V_{SS}$. A transient current couples through diode 31 and parasitic capacitance 82 as indicated by an arrow 112. Zener diode 27 breaks-down when a voltage across $V_{DD}$ and $V_{SS}$ exceeds the breakdown voltage of zener diode 27. Transient current from the ESD event is dissipated through zener diode 27 as indicated by an arrow 113. The breakdown voltage of zener diode 27 is greater than the supply voltages but is substantially less than a voltage that would be harmful to any circuitry coupled to pad 12 and the power supply lines $V_{DD}$ and $V_{SS}$.

Figure 8:
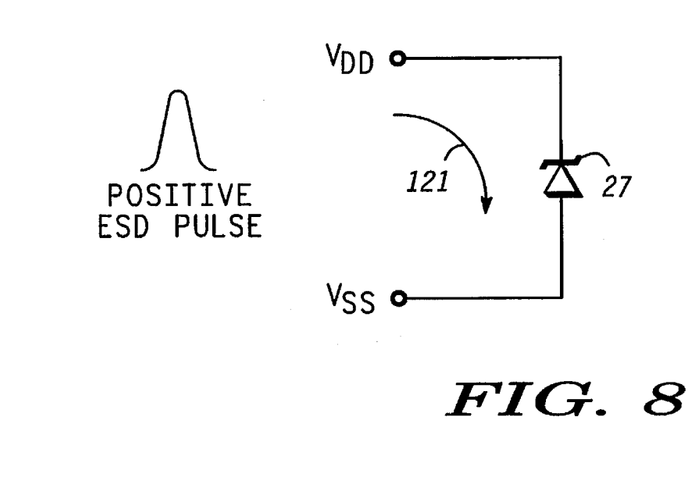
FIG. 8 is a diagram illustrating ESD protection circuitry for dissipating a positive ESD pulse, the ESD protection circuitry comprising zener diode 27 of FIG. 1.

FIG. 8 is a diagram of a portion of the ESD protection circuitry of FIG. 1 for dissipating a positive ESD pulse between the power supply lines $V_{DD}$ and $V_{SS}$. Zener diode 27 will breakdown down when the voltage across the power supply lines $V_{DD}$ and $V_{SS}$ exceeds its breakdown voltage. The voltage across $V_{DD}$ and $V_{SS}$ is clamped to the breakdown voltage. The transient current from the ESD event is indicated by an arrow 121.

Figure 9:
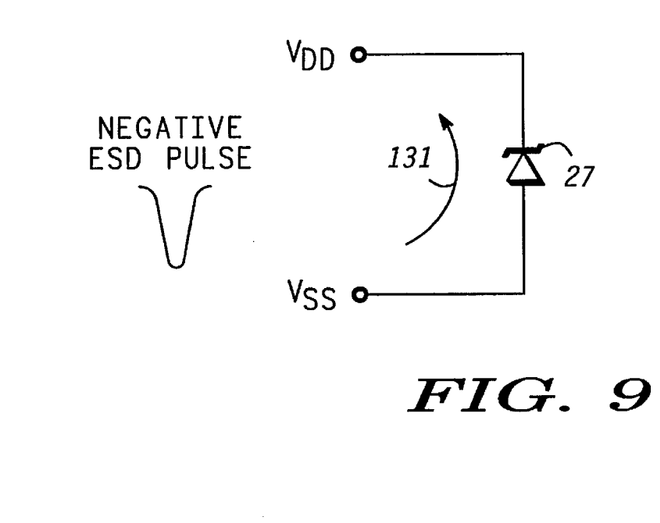
FIG. 9 is a diagram illustrating ESD protection circuitry for dissipating a negative ESD pulse, the ESD protection circuitry comprising zener diode 27 of FIG. 1.

FIG. 9 is a diagram of a portion of the ESD protection circuitry of FIG. 1 for dissipating a negative ESD pulse between the power supply lines $V_{DD}$ and $V_{SS}$. Zener diode 27 is forward biased by the negative ESD pulse. Transient current is dissipated through forward biased zener diode 27 as indicated by an arrow 131.

Figure 10:
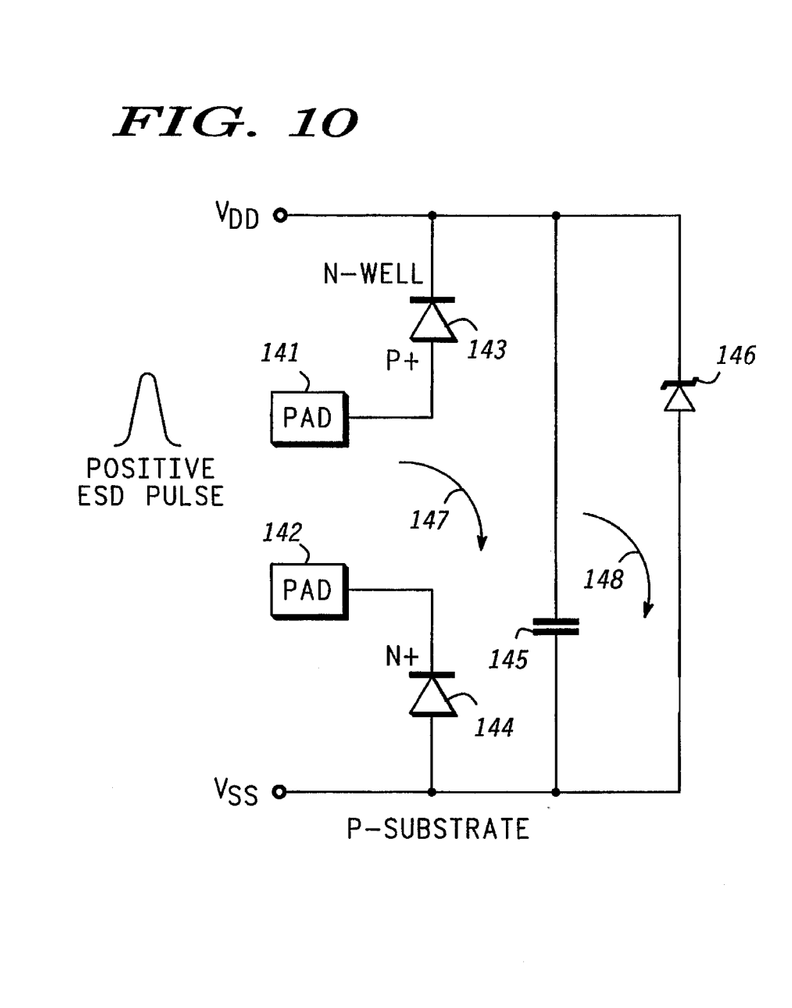
FIG. 10 is a diagram illustrating a positive ESD pulse applied between two pads.

FIG. 10 is a diagram illustrating an ESD event between a pad 141 and a pad 142. Each pad has ESD protection circuitry similar to that shown in FIG. 1. A positive ESD pulse is applied across pads 141 and 142. A diode 143 corresponds to diode 43 of FIG. 1 is forward biased as the voltage on pad 141 exceeds the power supply line $V_{DD}$. A transient current of the ESD event couples through diode 143 and a parasitic capacitance 145 as indicated by an arrow 147. Parasitic capacitance 145 couples between the power supply lines $V_{DD}$ and $V_{SS}$. Diode 144 corresponds diode 31 of FIG. 1. Diode 144 provides a current path to pad 142.

Zener diode 146 corresponds to zener diode 27 of FIG. 1. Zener diode 146 breaks-down when the voltage across the power supply lines $V_{DD}$ and $V_{SS}$ exceeds its breakdown voltage. A transient current from the ESD event is indicated by an arrow 148.

Figure 11:
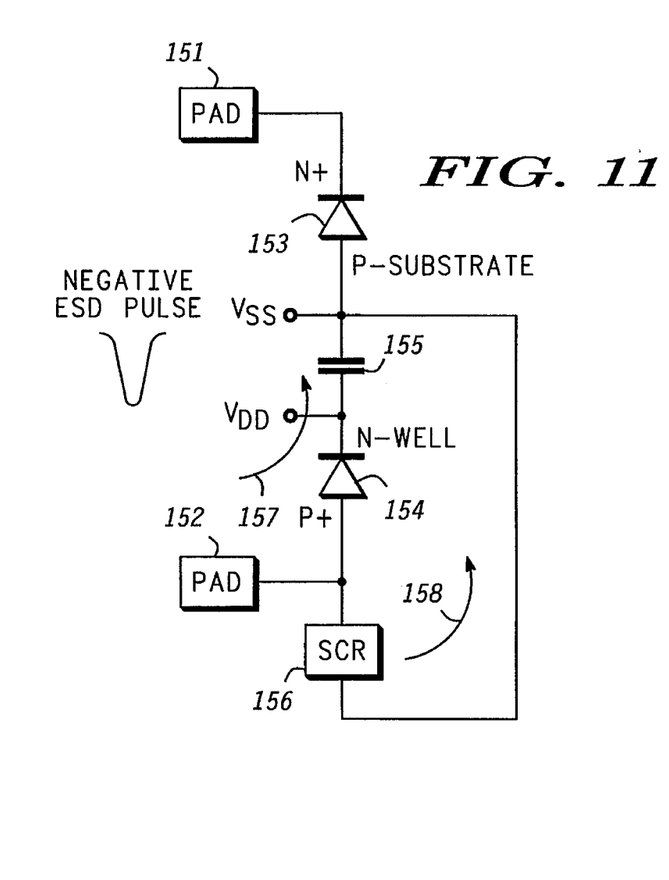
FIG. 11 is a diagram illustrating a negative ESD pulse applied between two pads.

FIG. 11 is a diagram illustrating an ESD event between a pad 151 and a pad 152. Each pad has ESD protection circuitry similar to that shown in FIG. 1. The negative ESD pulse forward biases a diode 153 and a diode 154. Diode 153 and diode 154 respectively correspond to diode 31 and 43 of FIG. 1. A parasitic capacitance 155 couples between the power supply lines $V_{DD}$ and $V_{SS}$. A transient current from the ESD event is indicated by an arrow 157.

A SCR 156 corresponds to SCR 30 of FIG. 1. SCR 156 is triggered by the ESD event shorting pad 152 to the power supply line $V_{SS}$. The low impedance of SCR 156 dissipates the negative ESD pulse.

By now it should be appreciated that an I/O circuit with ESD protection circuitry has been provided that prevents ESD damage from a pad to either power supply line, from a pad to another pad, or between the power supply lines. Transistor gates are protected from an ESD event by high speed, low leakage zener diodes. A zener diode is also coupled between the power supply lines. A SCR is coupled to each pad for providing a low impedance to dissipate an ESD event before damaging voltages are developed. The SCR is enabled by a transistor that tracks the breakdown mechanism of an output transistor of the I/O circuit. The SCR trigger is made process independent by the use of the transistor since it will always trigger before or simultaneously with a corresponding output transistor during an ESD event.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. An Electrostatic Discharge (ESD) protection circuit for a pad of an integrated circuit, the ESD circuit comprising:

a Silicon Controlled Rectifier (SCR) comprising:

a first transistor having a first electrode, a control electrode, and a second electrode coupled to the pad wherein said first transistor is a bipolar PNP transistor;

a second transistor having a first electrode coupled to said control electrode of said first transistor, a control electrode coupled to said first electrode of said first transistor, and second electrode coupled for receiving a first power supply voltage wherein said second transistor is a bipolar NPN transistor;

a first resistor having a first terminal coupled to the pad and a second terminal coupled to said control electrode of said first transistor;

a second resistor having a first terminal coupled to said first electrode of said first transistor and a second terminal coupled for receiving said first power supply voltage;

a third transistor for triggering said SCR having a first electrode coupled to said control electrode of said first transistor, a control electrode coupled for receiving said first power supply voltage, and second electrode coupled to said first electrode of said first transistor wherein said third transistor is disabled by said first power supply voltage, wherein an ESD event breaks-down said third transistor for enabling said SCR, and wherein said third transistor is a Metal Oxide Semiconductor Field Effect Transistor (MOSFET);

an output stage comprising:

a p-channel enhancement MOSFET having a drain, a gate coupled for receiving a first control signal, and a source coupled for receiving a second power supply voltage;

a first resistor having a first terminal coupled to said drain of said p-channel enhancement MOSFET and a second terminal coupled to the pad;

a second resistor having a first terminal coupled to the pad and a second terminal;

a n-channel enhancement MOSFET having a drain coupled to said second terminal of said second resistor, a gate coupled for receiving a second control signal, and a source coupled for receiving said first power supply voltage;

a first zener diode having an anode coupled to said gate of said p-channel enhancement MOSFET and a cathode coupled for receiving said second power supply voltage; and a second zener diode having an anode coupled for receiving said first power supply voltage and a cathode coupled to said gate of said n-channel enhancement MOSFET.

2. The Electrostatic Discharge (ESD) circuit of claim 1 wherein said third transistor of said SCR is a n-channel enhancement MOSFET formed similarly to said n-channel enhancement MOSFET of said output stage and wherein said third transistor of said SCR and said n-channel enhancement MOSFET of said output stage breakdown similarly due to an ESD event.

3. The Electrostatic Discharge (ESD) protection circuit of claim 1 further including:

a first diode having an anode coupled to the pad and a cathode coupled for receiving a second power supply voltage; and a second diode having an anode coupled for receiving said first power supply voltage and a cathode coupled to the pad.

4. The Electrostatic Discharge (ESD) protection circuit of claim 1 further including a zener diode having an anode coupled for receiving said first power supply voltage and a cathode coupled for receiving a second power supply voltage.

5. The Electrostatic Discharge (ESD) protection circuit of claim 1 further including an input stage comprising:

a p-channel enhancement MOSFET having a drain, a gate, and a source coupled for receiving a second power supply voltage;

a n-channel enhancement MOSFET having a drain coupled to said drain of said p-channel enhancement MOSFET, a gate coupled to said gate of said p-channel enhancement MOSFET, and a source coupled for receiving said first power supply voltage;

a resistor having a first terminal coupled to the pad and a second terminal coupled to said gate of said p-channel enhancement MOSFET; and a zener diode having an anode coupled for receiving said first power supply voltage and a cathode coupled to said gate of said p-channel enhancement MOSFET.

6. An Input/Output (I/O) circuit of an integrated circuit having Electrostatic Discharge (ESD) protection circuitry for preventing an ESD event from damaging circuitry of the integrated circuit, the I/O circuit comprising:

a first output transistor of a first conductivity type having a first electrode, a control electrode coupled for receiving a first output control signal, and a second electrode coupled for receiving a first power supply voltage;

a first resistor having a first terminal coupled to a pad and a second terminal coupled to said first electrode of said first output transistor;

a bipolar PNP transistor having a collector, a base, and an emitter coupled to said pad;

a second resistor having a first terminal coupled to said pad and a second terminal coupled to said base of said bipolar PNP transistor;

a third resistor having a first terminal coupled to said collector of said bipolar PNP transistor and a second terminal coupled for receiving said first power supply voltage;

a bipolar NPN transistor having a collector coupled to said base of said bipolar PNP transistor, a base coupled to said collector of said bipolar PNP transistor, and an emitter coupled for receiving said first power supply voltage;

a first transistor of said first conductivity type having a first electrode coupled to said base of said bipolar PNP transistor, a control electrode coupled for receiving said first power supply voltage, and a second electrode coupled to said collector of said bipolar PNP transistor;

a second output transistor of a second conductivity type having a first electrode, a control electrode coupled for receiving a second output control signal, and a second electrode coupled for receiving a second power supply voltage;

a fourth resistor having a first terminal coupled to said first electrode of said second output transistor and a second terminal coupled to said pad;

a first zener diode having an anode coupled to said control electrode of said second output transistor and a cathode coupled for receiving said second power supply voltage; and a second zener diode having an anode coupled for receiving said first power supply voltage and a cathode coupled to said control electrode of said first output transistor.

7. The Input/Output (I/O) circuit as recited in claim 6 wherein said first output transistor and said first transistor are similarly formed and wherein said first resistor is a ballast resistor for distributing current equally throughout said first output transistor.

8. The Input/Output (I/O) circuit as recited in claim 7 wherein said first transistor is disabled and wherein said first transistor breaks-down under the ESD event for providing base current to said bipolar PNP and NPN transistors.

9. The Input/Output (I/O) circuit as recited in claim 6 further including a third zener diode having an anode coupled for receiving said first power supply voltage and a cathode coupled for receiving said second power supply voltage.

10. The Input/Output (I/O) circuit as recited in claim 9 further including:

a second transistor of said second conductivity type having a first electrode, a control electrode, and a second electrode coupled for receiving said second power supply voltage;

a third transistor of said first conductivity type having a first electrode coupled to said first electrode of said second transistor, a control electrode coupled to said control electrode of said second transistor, and a second electrode coupled for receiving said first power supply voltage;

a fifth resistor having a first terminal coupled to said control electrode of said second transistor and a second terminal coupled to said pad; and a fourth zener diode having an anode coupled for receiving said first power supply voltage and a cathode coupled to said control electrode of said second transistor.

11. The Input/Output (I/O) circuit as recited in claim 10 wherein said first, second, third, and fourth zener diodes each have said cathode formed from a phosphorous implant having a doping less than 5.0 E18 per cubic centimeter.

12. The Input/Output (I/O) circuit as recited in claim 6 further including:

a first diode having an anode coupled for receiving said first power supply voltage and a cathode coupled to said pad; and a second diode having an anode coupled to said pad and a cathode coupled for receiving a second power supply voltage.

\* \* \* \* \*